United States Patent
Nakasuji

[19]

[11] Patent Number: 5,847,402
[45] Date of Patent: Dec. 8, 1998

[54] CHARGED PARTICLE BEAM PATTERN TRANSFER APPARATUS AND METHOD

[75] Inventor: Mamoru Nakasuji, Yokohama, Japan

[73] Assignee: Nikon Corporation, Tokyo, Japan

[21] Appl. No.: 768,201

[22] Filed: Dec. 17, 1996

[30] Foreign Application Priority Data

Dec. 26, 1995 [JP] Japan ................................. 7-338372

[51] Int. Cl.⁶ ............................................. H01J 37/30
[52] U.S. Cl. ........................... 250/492.2; 250/396 ML; 250/398
[58] Field of Search ..................... 250/396 ML, 398, 250/492.21, 492.2

[56] References Cited

U.S. PATENT DOCUMENTS 5,260,151  11/1993  Berger et al. ........................... 430/5
5,466,904  11/1995  Pfeiffer et al. ................... 250/396 ML
5,545,902  8/1996  Pfeiffer et al. .......................... 250/398

*Primary Examiner*—Bruce Anderson
*Attorney, Agent, or Firm*—Klarquist Sparkman Campbell Leigh & Whinston, LLP

[57] ABSTRACT

This invention concerns a charged particle beam pattern transfer system which uses a flux of charged particles, e.g. from an electron or ion beam, to transfer a mask pattern to a sensitized substrate. In particular, the invention is applicable to an electron beam reduction transfer system which demagnifies and transfers a mask pattern defined by multiple mask subfields to a sensitized substrate using the step-and-repeat transfer method. The invention provides a system for transferring the mask subfields, separated from one another on the mask by boundary strips, onto a wafer such that the transferred images of the mask subfields are joined together on the wafer as transfer subfields lacking any intervening boundary regions.

21 Claims, 4 Drawing Sheets

CHARGED PARTICLE BEAM PATTERN TRANSFER APPARATUS AND METHOD

FIELD OF THE INVENTION

This invention pertains to charged particle beam pattern transfer apparatus as used, for example, in the semiconductor industry for transferring, via a charged particle beam, a circuit pattern defined by a mask onto the surface of a substrate such as a wafer.

BACKGROUND OF THE INVENTION

Patterning systems for integrated circuit fabrication are designed to quickly form patterns with small feature sizes on a sensitized surface of semiconductor wafers. Rapid pattern formation permits high throughput, i.e. a large number of wafers are processed per unit time.

In recent years, advances have been made in charged-particle-beam pattern-transfer (CPBPT) systems that achieve improved pattern resolution (smaller feature size and higher feature density) and throughput. Prior-art CPBPT systems are static in that they transfer the pattern of a single die (equivalent to one of the many integrated circuits formed on a single wafer) or of multiple dies from a mask (also termed a "reticle") to a sensitized wafer or substrate in a one-shot exposure. (The wafers or substrates are generally sensitized by coating with a resist sensitive to the charged particle beam.) However, in static CPBPT systems, fabrication of the mask is difficult. In addition, it is difficult to control the aberrations of the lenses and deflectors (hereinafter collectively referred to as the "optical system") serving to refract and deflect the charged particle beam for passage through the mask to the wafer surface, especially when the optical system refracts and deflects a beam large enough to cover a field size of one or more dies.

"Step-and-repeat" systems have become increasingly used to control aberrations in CPBPT systems. In step-and-repeat CPBPT systems the pattern (e.g., a pattern corresponding to one die) to be transferred is subdivided into a plurality of subfields, and the pattern is transferred sequentially to the wafer where the pattern is "stitched" together to form each die, one subfield at a time.

The aberrations of the optical system used in a step-and-repeat CPBPT system should be small over as large a field as possible. Conventional optical systems known for controlling aberrations include: (1) the Moving Objective Lens (MOL) system, (2) the Symmetric Magnetic Doublet (SMD) system, and (3) the Projection Exposure with Variable Axis Immersion Lens (PREVAIL) system. The MOL system minimizes aberrations over wide fields by using a magnetic deflection field from a deflector to move the axis of an objective lens. In the SMD system, aberrations are reduced because the objective lens comprises an upper lens and a lower lens satisfying prescribed symmetry conditions. The PREVAIL system, while similar to the MOL method, uses as an objective lens a so-called immersion lens and the substrate to which the pattern is to be transferred is housed interior to this lens.

These three systems have various practical limitations. The MOL system requires a precisely controlled magnetic deflection field and the power supply for the deflector drive must be stable to about 0.25–1 ppm. Thus, the power supply is complex. The SMD system uses only a small angular aperture of the electron beam and the beam current is therefore relatively small. Thus, the system throughput is low. The PREVAIL method requires the same precisely controlled magnetic field as the MOL method. In addition, because it uses an immersion lens, the PREVAIL method requires a ferrite plate for the lens to be placed under the chuck and it is difficult to make the chuck in the required thickness.

A more recently developed optical system is the Moving Trajectory Projection (MTP) system. The MTP system transfers a demagnified image on the mask to the wafer using an imaging lens system in which a deflector aligns the charged particle beam trajectory with the axis of the optical system.

FIG. 4 shows a step-and-repeat electron-beam transfer system using an MTP optical system. An electron beam EB having a square transverse section is deflected from an optical axis AX of the optical system and is directed toward a mask subfield $33_1$, which is one of a plurality of mask subfields of the mask M. In FIG. 4, the Z axis is parallel to the optical axis and orthogonal coordinate axes X and Y are in a plane perpendicular to the Z axis. The patterned region of the mask M is first subdivided into a plurality of field bands along the Y direction and which are bounded by boundary regions $34_1, 34_2, \ldots, 34_{I-1}$. The first of the field bands is subdivided into a plurality of mask subfields $33_1, 33_2, \ldots, 33_N$ (where N is an integer greater than or equal to 2) bounded by boundary regions $35_1, 35_2, \ldots, 35_{N-1}$. Other field bands are likewise subdivided into mask subfields. The mask subfields $33_1$–$33_N$ transmit the electron beam in areas corresponding to the shape of the pattern to be transferred. The boundary regions $35_1, 35_2, \ldots, 35_{N-1}$, and $34_1, 34_2, \ldots, 34_{I-1}$ are non-patterned regions which, for example, may either block or scatter the electron beam.

After transmission by the mask subfield $33_1$, the electron beam EB is further deflected at positions P1 and P2 such that the beam travels along the optical axis AX. The deflections at P1 and P2 satisfy MTP deflection conditions, in which an electron beam having a trajectory that is parallel to the optical axis before deflection has a trajectory that is parallel to the optical axis after deflection.

A projection lens forms a crossover CO (an image of the electron-beam source) and an objective lens forms a demagnified image of the mask subfield at a particular location on the sensitized surface of a wafer W. For example, the demagnified image of the mask subfield $33_1$ is formed at the corresponding "transfer subfield" $38_1$ on the wafer. The electron beam EB is then deflected at positions P3 and P4 by deflectors that also satisfy MTP conditions. The electron beam is incident perpendicular to the transfer subfield $38_1$. The image of the portion of the pattern defined within the mask subfield $33_1$ is thus projected onto the corresponding transfer subfield $38_1$ at the prescribed demagnification. This process is repeated in steps the size of mask subfields $33_1$–$33_N$ and a reduced image of the pattern of each mask subfield is sequentially transferred to transfer subfields $38_1$–$38_N$.

Because the patterns in the field bands are sequentially transferred to the wafer W, the wafer W may be scanned in the +X (or −X direction) at a velocity $V_W$ in synchrony with the scanning of the mask M in the −X (or +X direction) at a velocity $V_M$.

Movement of the mask at the velocity $V_M$ sequentially brings each field band into position at or near intersection with the optical axis to allow the field band's subfield patterns to be sequentially transferred to the corresponding transfer subfields on the wafer. Thus, all the subfields of the mask are transferred to the wafer. Various aberrations including focus errors and distortion are corrected as much as possible during transfer. This method allows pattern transfer over an optically wide region with satisfactory resolution and positional accuracy and thus represents an improvement over the static transfer method.

Further with respect to FIG. 4, the mask subfields $33_1$–$33_N$ are spaced apart by boundary regions (non-patterned regions) $34_1, 34_2, \ldots$ and $35_1, 35_2, \ldots$ In the MTP method, the transfer subfields $38_1$–$38_N$ are contiguous to respective immediately adjacent transfer subfields. In order to transfer the patterns so that they are contiguous on the wafer in this manner, it is necessary to cause the MTP deflectors to offset the beam in the Y direction a distance corresponding to the number of subfields and the boundary regions between them. In addition, to make the transfer subfields contiguous in the X-direction, the ratio between the scanning velocity at the mask and the scanning velocity at the wafer must be controlled, along with the magnitude of beam deflection imparted by the deflector(s), so as to offset in the X direction the transfer subfield on the wafer W by an amount corresponding to the boundary region separations in the X-direction.

Unfortunately, correcting MTP-based deflections as described above to make transfer subfields contiguous violates the MTP conditions. Whenever MTP conditions are not satisfied, "seams" between adjacent transfer subfields are not precise, transfer-subfield alignment tolerances at such seams are exceeded, and device yield declines. In addition, not satisfying MTP conditions can cause the principal ray of the electron beam to be no longer perpendicularly incident on the wafer. This causes the demagnification achieved for a particular transfer subfield to vary, relative to other transfer subfields, with the position of the transfer subfield relative to the optical axis or with variations in substrate thickness. Such varying demagnification causes deterioration of registration between different patterned layers on the substrate, thereby further reducing device yields.

SUMMARY OF THE INVENTION

In order to overcome the problems discussed above, this invention provides a step-and-repeat charged-particle-beam pattern-transfer (CPBPT) apparatus that permits adjacent transfer subfields on the wafer to be accurately aligned with each other even when the corresponding mask-subfield patterns are separated by boundary regions.

The invention also provides a CPBPT apparatus that, whenever pattern transfer is performed according to the step-and-repeat method, is operable not only to accurately "stitch" the transfer subfields together on the wafer surface but also to maintain during pattern transfer a perpendicular incidence of the charged particle beam on the substrate (wafer) surface.

A CPBPT apparatus of the invention also provides position-correcting deflectors between either the mask and a first MTP deflector set or between a second MTP deflector set and the substrate, or at both such locations. The position-correcting deflectors (collectively constituting in part a "position-correcting deflection system") correct the position at which a charged particle beam, propagating from the mask, is incident on the substrate. The apparatus so equipped has the particular advantage of permitting the mask subfields to be sequentially transferred to corresponding transfer subfields on the wafer, using the step-and-repeat method, such that the transfer subfields are accurately stitched together even when the mask subfields are separated from each other by boundary regions.

Furthermore, the position-correcting deflection system is separate from other parts of the optical system. For example, as stated above, the position-correcting deflection system can be situated before the first MTP deflector set or after the second MTP deflector set. As a result, the position-correcting deflection system does not disturb the low-aberration characteristics of the optical system.

Also according to the present invention, if any of the position-correcting deflectors comprises plural sub-deflectors, the incidence position of the charged particle beam on the substrate can be laterally offset by a comparatively large amount with little change in the direction of the principal ray of the beam. This is especially advantageous for large masks requiring large offsets.

Whenever the position-correcting deflection system comprises multiple sets of position-correcting deflectors, and the deflection angles produced by such deflector sets are substantially equal, the entrance and exit angles of the beam with respect to the sets of deflectors may be made substantially equal while still allowing the principal ray of the beam to be perpendicularly incident on the wafer surface. This provides improved constancy of demagnification even with small changes in substrate thickness, thereby providing more accurate alignment of transfer subfields on the wafer surface.

The position-correcting deflection system can comprise a third position-correcting deflector set located between the mask and the first MTP deflector set, and/or a fourth position-correcting deflector set located between the second MTP deflector set and the wafer. With such a system, if the mask image is demagnified on the wafer surface by the factor $1/\beta$ (where $\beta$ is a real number), and if the beam deflection imparted by the third position-correcting deflector set is $\beta$ times the beam deflection imparted by the fourth position-correcting deflector set, then such symmetrical operation of the third and fourth position-correcting deflector sets can provide better control of the position at which the beam strikes the substrate.

The foregoing and other objects, features, and advantages of the invention will become more apparent from the following detailed description of a preferred embodiment which proceeds with reference to the accompanying drawings.

DETAILED DESCRIPTION OF A PREFERRED EMBODIMENT

An example embodiment, representing the current best mode, of a charged-particle-beam pattern-transfer (CPBPT) apparatus according to the present invention is described with reference to FIGS. 1–3. This example embodiment is a step-and-repeat CPBPT apparatus employing an electron beam (as a representative charged particle beam) and that reductively transfers the mask pattern to the substrate surface. For the purpose of explaining the present invention, the demagnification factor is 1/β.

Figure 1:
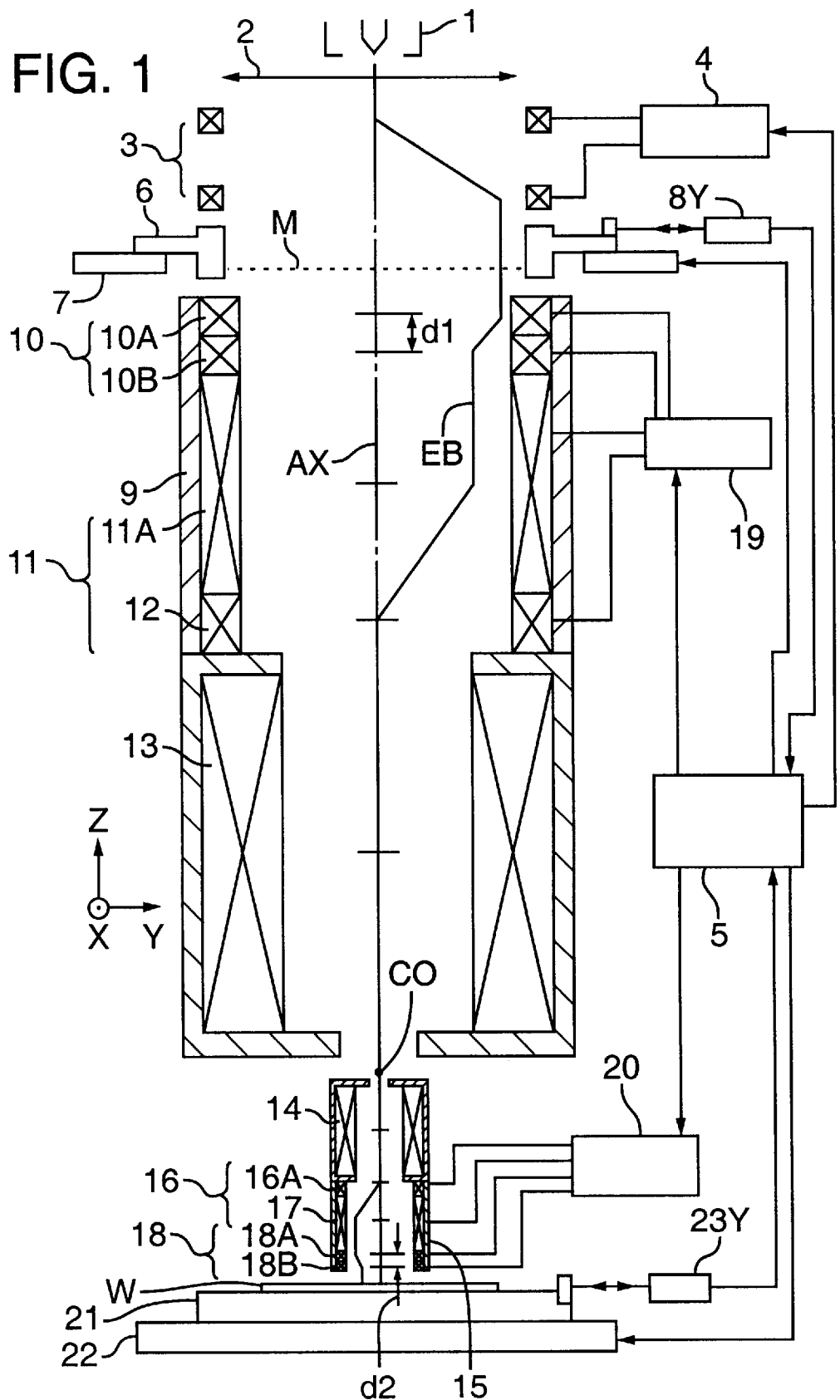
FIG. 1 is a schematic vertical section of an example embodiment of an electron beam pattern transfer system according to the invention.

In FIG. 1, the Z axis is parallel to the optical axis AX of the (electron) optical system. The X axis is perpendicular to the plane of the page and the Y axis is perpendicular to both the X and Z axes. These coordinate axes are shown in FIG. 1.

Referring further to FIG. 1, an electron beam EB emitted from an electron gun 1 is collimated by a condenser lens 2 and then deflected by a subfield-selection deflector 3 and directed toward a desired subfield on a mask M. The amount of deflection imparted by the subfield-selection deflector 3 is set via a first deflection controller 4 in response to commands from a main controller 5, which has overall control of the CPBPT system.

After passing through the mask M, the electron beam EB propagates parallel to the optical axis AX until the beam is deflected by a first position-correcting deflector set 10 comprising subdeflectors 10A and 10B. The beam is then further deflected by a first MTP deflector set 11 comprising subdeflectors 11A and 12. After these deflections, the electron beam EB propagates along the optical axis AX. The first MTP deflector set 11 satisfies MTP conditions such that the electron beam, propagating parallel to but at a distance from the optical axis AX when entering the first MTP deflector set 11, has a trajectory along the optical axis when the beam leaves the first MTP deflector set 11.

An MTP projection lens 13 forms an electron-beam crossover CO on the optical axis AX. An MTP objective lens 14 then forms an inverted and demagnified image of the selected mask subfield.

The electron beam EB is then deflected away from the optical axis AX by a second MTP deflector set 16 comprising subdeflectors 16A and 17. The electron beam EB then propagates along a trajectory parallel to but displaced from the optical axis AX. The second MTP deflector set satisfies MTP conditions in that the electron beam propagating along the optical axis AX is deflected so as to propagate parallel to and displaced from the optical axis.

A second position-correcting deflector set 18 comprising subdeflectors 18A and 18B then deflects the electron beam EB. The beam then strikes a transfer subfield, corresponding to the mask subfield, on the sensitized wafer so as to transfer an inverted, demagnified (by 1/β) image of the subfield pattern to the transfer subfield.

The subdeflectors 10A, 10B, 11A, and 12 are preferably magnetic deflectors utilizing an electrically conductive coil wound inside a ferrite core 9. Similarly, the subdeflectors 16A, 17, 18A, and 18B are preferably magnetic deflectors each utilizing an electrically conductive coil wound inside a ferrite core 15. Alternatively, any of these subdeflectors can be electrostatic.

A second deflection controller 19 and the main controller 5 are operable to determine the magnitude of beam deflections imparted by the subdeflectors 10A, 10B, 11A, and 12. Similarly, a third deflection controller 20 and the main controller 5 are operable to determine the magnitude of beam deflections imparted by the subdeflectors 16A, 17, 18A, and 18B.

The first position-correcting deflector set 10 is preferably situated between the first MTP deflector set 11 and the mask M. The second position-correcting deflector set 18 is preferably situated between the second MTP deflector set 16 and the wafer W. In this embodiment, the amount by which the electron beam EB is deflected by the first position-correcting deflector set 10 is −β (the minus sign corresponds to an inverted image) times the amount by which the electron beam is deflected by the second position-correcting deflector set 18. Further, the axial distance d1 between the subdeflector 10A and the subdeflector 10B is preferably β·d2, wherein d2 is the axial distance between the subdeflectors 18A and 18B.

In order to maintain satisfactory operation of the other deflectors in this apparatus, the angles at which the electron beam EB enters and exits the first position-correcting deflector set 10 are preferably equal. Similarly, the angles at which the electron beam EB enters and exits the second position-correcting deflector set 18 are preferably equal. Furthermore, the angles by which the electron beam EB is deflected by the subdeflectors 10A and 10B are preferably equal in magnitude but of opposite sign and the angles by which the electron beam EB is deflected by the subdeflectors 18A and 18B are preferably equal in magnitude but of opposite sign. In addition, the angles by which the electron beam EB is deflected by the subdeflectors 10A and 18A are preferably equal in magnitude but of opposite sign, and the angles by which the electron beam EB is deflected by the subdeflectors 10B and 18B are preferably equal in magnitude but of opposite sign.

The mask M is mounted in a plane parallel to the XY plane on a mask stage 6. The mask stage 6 is operable to perform, via an internal drive (not shown), a continuous movement of the mask M in the X direction and a stepped movement of the mask M in the Y direction relative to a mask base 7. The position of the mask stage 6 in the Y direction is detected preferably using a laser interferometer 8Y. Information from the laser interferometer 8Y is transmitted to the main controller 5 for processing.

The wafer W is mounted parallel to the XY plane on a chuck 21 mounted on a movable wafer stage 22. The chuck 21 is constructed such that a drive (not shown) internal to the wafer stage 22 moves the chuck 21 (with wafer W) continuously in the X direction and in a stepped manner in the Y direction. The position of the chuck 21 in the Y direction is detected preferably using a laser interferometer 23Y. Information from the laser interferometer 23Y is transmitted to the main controller 5 for processing.

Exposure data such as mask data, information regarding subfield layout, and information about the wafer and its sensitization are supplied to the main controller 5 from an exposure-data recording device (not shown). Based on such exposure data, the main controller 5 controls the amounts of deflection of electron beam EB in the X direction and the Y direction via the deflection controllers 4, 19, and 20. By controlling the positions and transverse velocities of the mask stage 6 and the wafer chuck 21, the main controller 5 ensures that transfer subfields on the wafer W receive the reduced images of the mask-subfield patterns intended for those transfer subfields.

Figure 2:
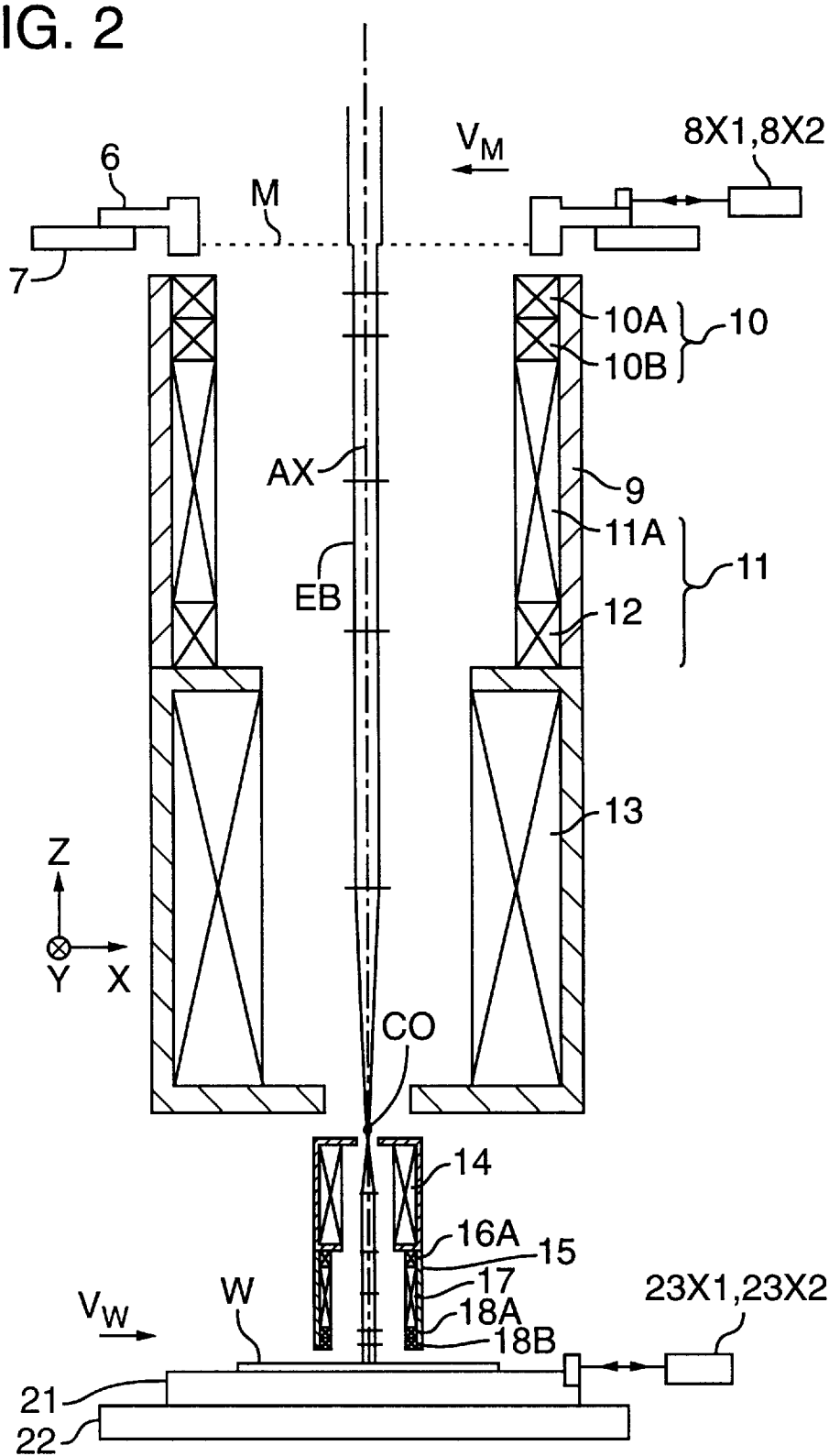
FIG. 2 is a schematic vertical section of the electron beam pattern transfer system of FIG. 1 in a plane perpendicular to the section shown in FIG. 1.

FIG. 2 shows an orthogonal cross-sectional diagram of the system of FIG. 1 as viewed along the Y axis. The position of the mask stage 6 in the X direction is detected preferably using laser interferometers 8X1 and 8X2. Information from the laser interferometers 8X1, 8X2 is transmitted to the main controller 5 for processing. The laser interferometers 8X1, 8X2 provide the main controller 5 with data on the X-position and rotation of the mask stage 6. The X-position and rotation of the chuck 21 are likewise detected preferably using laser interferometers 23X1, 23X2 that transmit information to the main controller 5 for processing.

Figure 3A:
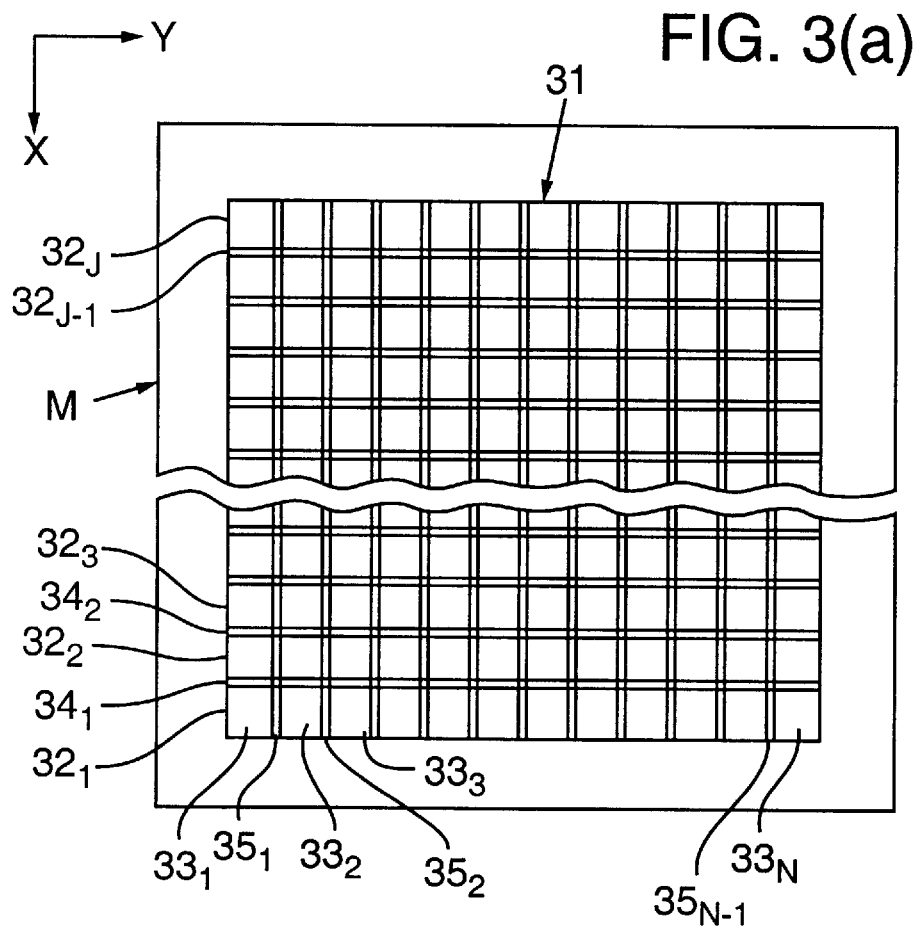
FIG. 3(a) is a plan view showing the arrangement of subfields on the mask M of FIG. 1.

FIG. 3(a) shows an example of a mask M defining a pattern to be transferred to the wafer. A patterned region 31 of the mask M is subdivided in the X direction (i.e. the scan direction) into field bands $32_1, 32_2, \ldots, 32_J$ having fixed width. Each of the field bands is subdivided in the Y direction (i.e. the cross-scan direction) into multiple subfields $33_1, 33_2, \ldots, 33_N$ (where J and N are integers greater than or equal to 2) having fixed width. The subfields contain the patterns to be transferred to the wafer. The electron beam individually irradiates a selected subfield from the patterned region 31. The field bands $32_1, 32_2, \ldots, 32_J$ are respectively separated by boundary regions (non-patterned regions) $34_1, 34_2, \ldots, 34_{J-1}$ of fixed width. The boundary regions may either block or scatter the electron beam. The subfields $33_1, 33_2, \ldots, 33_N$ are respectively separated by boundary regions (non-patterned regions) $35_1, 35_2, \ldots, 35_{N-1}$ of fixed width, which block or scatter the electron beam.

There are many types of electron-beam masks that can be used. One example is a so-called scattering mask, in which regions that transmit electrons with relatively little or no scattering are formed of a thin film of silicon nitride (SiN) and in which regions that substantially scatter electrons are made of a thin film of tungsten on the surface of the SiN film. Another example is a so-called perforated-stencil mask in which through-holes provided in a dispersing substrate made of tungsten serve as regions allowing passage of electrons. In addition, while the subfield boundary regions on the mask generally block or scatter electrons, it will be appreciated that the present invention is applicable to other types of boundary regions.

Figure 3B:
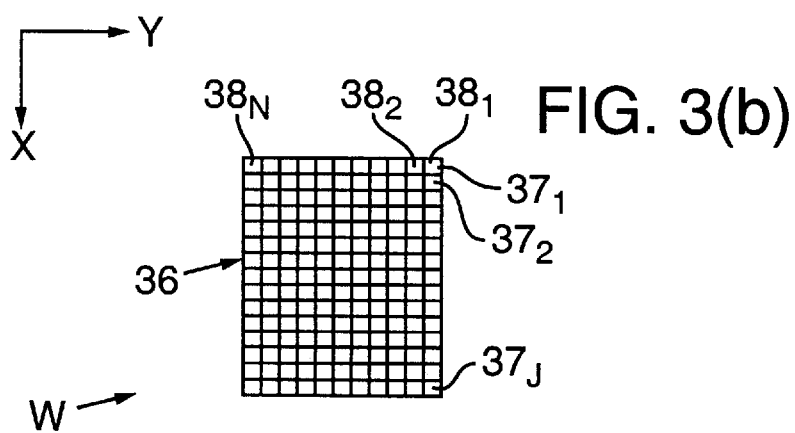
FIG. 3(b) is a plan view showing a representative transfer region on the wafer W of FIG. 1 resulting from transfer of the subfields in a mask such as that shown in FIG. 3(a).
Figure 4:
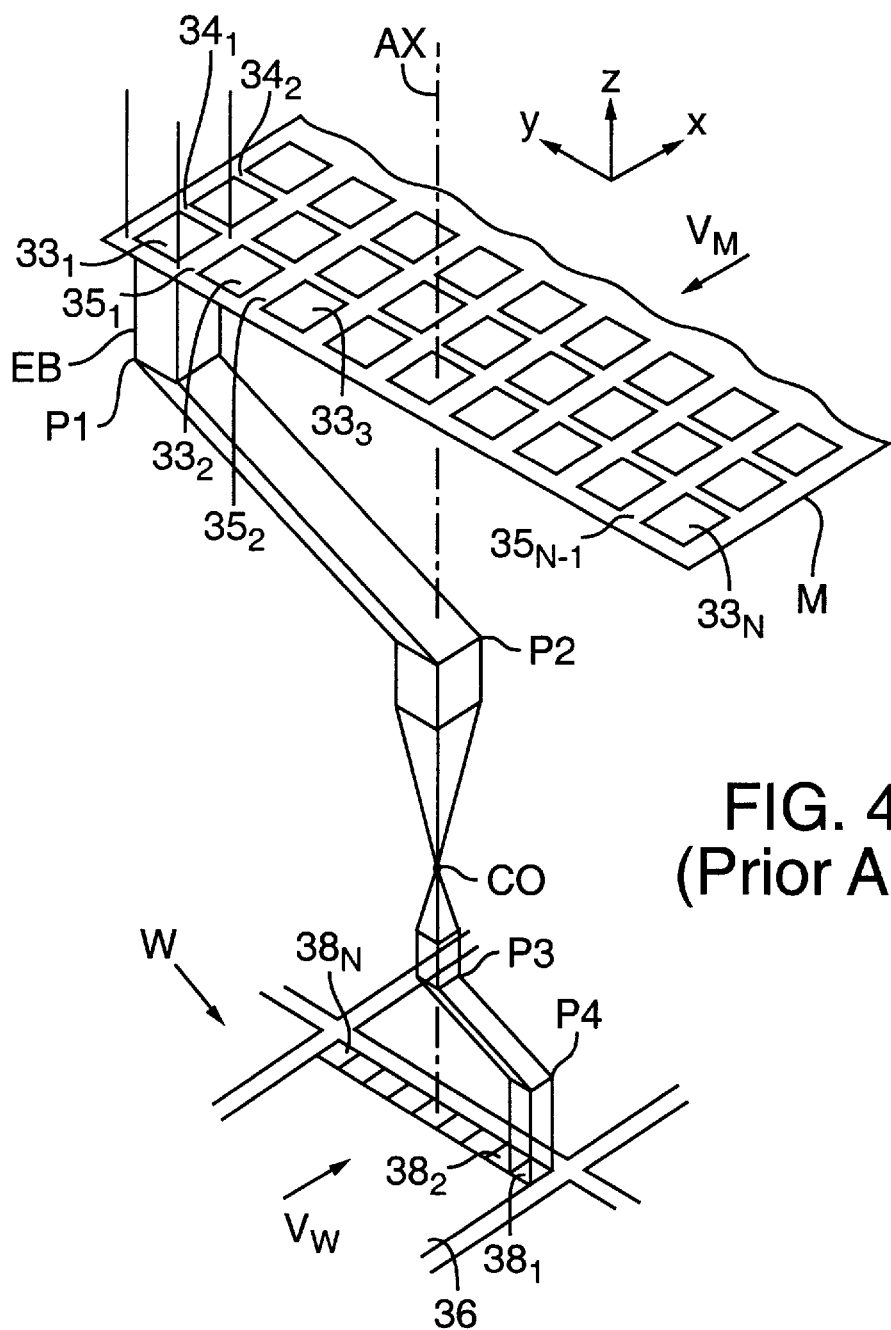
FIG. 4 is a diagram showing certain features of a prior art MTP-type electron beam pattern transfer system.

FIG. 3(b) shows a transfer region 36 on the wafer W. The transfer region 36 corresponds to one die. The transfer region 36 is subdivided in the X direction into transfer-region bands $37_1, 37_2, \ldots, 37_J$ at a prescribed spacing, and each of the transfer-region bands is respectively subdivided in the Y direction into multiple transfer subfields $38_1, 38_2, \ldots, 38_N$ at a prescribed spacing. During reductive transfer using an apparatus according to the invention, the patterns of the field bands $32_1, 32_2, \ldots, 32_J$ of the mask M are respectively transferred (without intervening boundary regions) to corresponding transfer-region bands $37_1, 37_2, \ldots, 37_J$ on the wafer. Within each of the transfer-region bands, the patterns of the subfields $33_1, 33_2, \ldots, 33_N$ of the mask M are respectively transferred to the transfer subfields $38_1, 38_2, \ldots, 38_N$.

As described above, the mask subfields are separated by boundary regions. The boundary regions are not transferred to the wafer. I.e. the transfer subfields are contiguous on the wafer surface without any intervening boundaries. I.e., a CPBPT system according to the present invention can accurately stitch together the subfield patterns, less the boundary regions, as contiguous transfer subfields on the wafer. In other words, during transfer of the subfields $33_1, 33_2, \ldots, 33_N$, the corresponding transfer subfields on the wafer are displaced laterally in the Y direction by an amount corresponding to the sum of the widths of the boundary regions $35_1, 35_2, \ldots, 35_{N-1}$ multiplied by the demagnification factor. As a result, the patterns in the transfer subfields $38_1, 38_2, \ldots, 38_N$ serially contact each other along their Y-facing edges.

Also, the transfer-region bands $37_1, 37_2, \ldots, 37_J$ on the wafer must serially contact each other along their X-facing edges. The wafer W is scanned in the +X (or −X direction) at a velocity VW in synchrony with the scanning of the mask M in the −X (or +X direction) at a velocity VM as shown in FIG. 2. Because the MTP projection lens 13 and the MTP objective lens 14 form an inverted image, the scan direction of the mask is opposite to that of the wafer. The subfields within the field band that essentially intersects the optical axis are sequentially transferred to the corresponding transfer subfields on the wafer W.

Because only the mask-subfield patterns and not the boundary regions are transferred to the wafer, the wafer and mask scan velocities must account for the demagnification of the mask and the width of the boundary regions. Representing the demagnification as $1/\beta$, the X-width of the field bands 32 as $L_{1X}$, and the X-width of the boundary regions 34 as $L_{2X}$, the scan velocity VM of the mask depends on the scan velocity VW at the wafer as follows:

$$VM = \beta[(L_{1X} + L_{2X})/L_{1X}] \cdot VW$$

The operation of this embodiment may be described in more detail with reference to FIG. 1. Any subfield on mask M irradiated by the electron beam EB (e.g., any of the subfields $33_1$–$33_N$ of FIG. 3(a)) is n subfields and n boundary regions (i.e., an amount corresponding to n of the boundary regions $35_1$–$35_{N-1}$ of FIG. 3(a)) away from the optical axis AX in the +Y direction. If the Y-width of one subfield is a and the Y-width of one boundary region is b, then the first position-correcting deflector set 10 displaces the electron beam EB in the −Y direction by an amount nb, the sum of the widths of the n boundary regions. The subdeflector 10A deflects the beam toward the optical axis by a prescribed angle θ and the subdeflector 10B then deflects the beam back by the opposite angle (−θ). The beam then continues to propagate parallel to the optical axis AX but offset toward the Y axis by a distance nb.

The subdeflector 11A of the first MTP deflector set 11 deflects the electron beam by an angle φ toward the optical axis. The subdeflector 12 then deflects the beam by the opposite angle (−φ). The beam then propagates along the optical axis AX, having been displaced toward the Y axis by an amount na (the sum of the widths of the n subfields). The electron beam is then focused by the MTP projection lens 13 and the MTP objective lens 14 to form an inverted image of the subfield pattern with a demagnification $1/\beta$. Because the electron beam propagates along the optical axis AX regardless of the mask subfield, the MTP projection lens 13 and the MTP objective lens 14 will produce an image of the subfield with little field curvature or other aberration. However, for subfields situated a large distance from the optical axis AX, it may be necessary to lower the excitation energy of the MTP projection lens 13 and the MTP objective lens 14 because of the long optical path length of the electron beam.

After the electron beam exits the MTP objective lens 14, the beam is deflected away from the optical axis AX by the subdeflector 16A (of the second MTP deflector set 16) at the same deflection angle φ as imparted by the MTP subdeflector 11A. The beam is then deflected back at the opposite angle (−φ) by the subdeflector 17. The beam then propagates parallel to the optical axis AX. The offset of the electron beam from the optical axis is $(na+nb)/\beta$ in the −Y direction.

Next, the electron beam is deflected in the opposite direction (i.e., toward the optical axis AX) by the subdeflector 18A (of the second position-correcting deflector set 18) at the angle −θ having the same magnitude as the deflection angle imparted by the subdeflector 10A. The beam is then deflected back by the opposite angle (θ) by the subdeflector 18B. The beam then propagates parallel to the optical axis AX and is incident perpendicularly at the prescribed transfer subfield on the wafer. The total offset of the beam by the subdeflectors 18A and 18B is $nb/\beta$ in the +Y direction. This displacement is $-1/\beta$ times the displacement produced by the subdeflectors 10A and 10B (i.e. nb in the −Y direction). This corresponds to the sum of the widths of the demagnified images of n boundary regions.

As a result of these deflections, the displacement of the beam at the wafer with respect to the optical axis AX is $na/\beta$ in the $-Y$ direction and the position at which the reduced image of a mask subfield is transferred to a transfer subfield on the wafer is offset by an amount corresponding to the widths of the reduced images of n of the boundary regions on the mask M. In this manner, the transfer subfields $38_1$–$38_N$ are accurately joined together serially on their Y-facing edges.

As shown in FIG. 2, the subfields to be transferred from the mask are generally closer to the optical axis AX in the scan direction (X direction) than in the Y direction. But, in moving from one field band to the next it is necessary to deflect the beam so that it skips over the boundary regions 34 as shown in FIG. 3(a). The subdeflectors 10A, 10B of the first position-correcting deflector set 10 and the subdeflectors 18A, 18B of the second position-correcting deflector set 18 offset the beam position in the X direction by an amount corresponding to the boundary region. Thus, the transfer subfields $38_1$–$38_N$ of adjacent transfer-region bands on the wafer are transferred such that they are accurately joined along their X-facing edges.

The optical system from the subdeflector 11 to the subdeflector 17 preferably achieves perpendicular incidence of the electron beam EB on the surface of the wafer W. In addition, because the angles at which the electron beam EB enters and exits the first position-correcting deflector set 10 are equal, and the angles at which the electron beam EB enters and exits the second position-correcting deflector set 18 are equal, perpendicular incidence of the electron beam on the wafer surface is assured.

Because the first and second position-correcting deflector sets are arranged axially outside the first and second MTP deflector sets, the electron beam can be laterally displaced as required without disturbing the low-aberration characteristics of the MTP deflector sets.

Because the lateral extent of the field bands in the Y direction may be relatively large, the position-correcting deflector sets are operable to impart large deflections of the beam as required. Therefore, the first position-correcting deflector set 10 comprises two subdeflectors (10A, 10B) and the second position-correcting deflector set 18 comprises two subdeflectors (18A, 18B). However, if the field bands on a mask have relatively small extent in the Y direction thus require only small deflections, the first and second position-correcting deflector sets may function satisfactorily with only a single subdeflector each. In such an instance, the angles by which the beam is deflected by the position-correcting deflector sets would be equal in magnitude but opposite in sign. This would permit proper stitching together of transfer subfields while still maintaining a perpendicular incidence of the beam on the wafer surface.

Whereas the position-correcting deflector sets are preferably provided near both the mask M and the wafer W, as shown in FIG. 1, a position-correcting deflector set could be provided near one or the other of these locations and still function satisfactorily under certain conditions.

As will be apparent to those skilled in the art, this invention can be applied to charged particle beam transfer systems using ion beams or other charged particle beams.

Whereas the invention has been described in connection with a preferred embodiment and various alternatives to that embodiment, it will be understood that the invention is not limited to that embodiment. On the contrary, the invention is intended to encompass all alternatives, modifications, and equivalents as may be included within the spirit and scope of the invention as defined by the appended claims.

What is claimed is:

1. A charged particle beam pattern transfer apparatus for transferring to a substrate a pattern defined by multiple subfields on a mask, the apparatus comprising:
   (a) a first main deflector set situated relative to an optical axis of the apparatus, the first main deflector set being operable to deflect toward the optical axis a charged particle beam that has passed through a mask subfield;
   (b) an imaging lens system operable to focus the charged particle beam deflected by the first deflector set;
   (c) a second main deflector set situated relative to the optical axis, the second main deflector set being operable to deflect, toward a transfer subfield on the substrate corresponding to the mask subfield, the charged particle beam focused by the imaging lens system; and
   (d) a first position-correcting deflector set situated relative to the optical axis between either the mask and the first main deflector set or the second main deflector set and the substrate, the first position-correcting deflector set being operable to deflect the charged particle beam and thus correct the position at which the charged particle beam, that has passed through a mask subfield, is incident upon the substrate so as to compensate for any discrepancies in the positions of the transfer subfields relative to each other compared to the positions of the mask subfields relative to each other.

2. The apparatus of claim 1, wherein each of the first and second main deflector sets are moving-trajectory-projection deflector sets.

3. The apparatus of claim 1, wherein the mask subfields are separated from each other by boundary regions, the first position-correcting deflector set being operable to deflect the charged particle beam in a manner whereby the boundary regions are not reproduced between transfer subfields on the substrate.

4. The apparatus of claim 1, further comprising a second position-correcting deflector set, wherein the first position-correcting deflector set is situated between the mask and the first main deflector set and the second position-correcting deflector set is situated between the second main deflector set and the substrate.

5. The apparatus of claim 4, exhibiting a demagnification of $1/\beta$ (where $\beta$ is a real number), wherein the first position-correcting deflector set is operable to displace the beam from the optical axis $\beta$ times the displacement of the beam from the second position-correcting deflector set.

6. The apparatus of claim 4, wherein each of the first and second position-correcting deflector sets comprises two subdeflectors.

7. The apparatus of claim 6, wherein each of the subdeflectors of the first position-correcting deflector set deflects the beam at equal but opposite deflection angles, and each of the subdeflectors of the second position-correcting deflector set deflects the beam at equal but opposite deflection angles, thereby ensuring the beam exits each position-correcting deflector set at an angle relative to the optical axis that is the same angle by which the beam enters the respective position-correcting deflector set.

8. The apparatus of claim 7, wherein the charged particle beam is incident to the mask perpendicularly to the plane of the mask, and is incident to the substrate perpendicularly to the plane of the substrate.

9. The apparatus of claim 1, wherein the charged particle beam is an electron beam.

10. The apparatus of claim 1, further comprising a second position-correcting deflector set, wherein the first position-correcting deflector set is situated between the mask and the first main deflector set and the second position-correcting deflector set is situated between the second main deflector set and the substrate, each of the first and second position-correcting deflector sets comprising plural subdeflectors axially spaced from each other, the subdeflectors of the first position-correcting deflector set having an axial spacing therebetween that is $\beta$ times the axial spacing between the subdeflectors of the second position-correcting deflector set, wherein $1/\beta$ is the absolute value of the demagnification from the mask to the substrate.

11. The system of claim 10, wherein each of the subdeflectors of the first position-correcting deflector set deflects the beam at equal but opposite deflection angles, and each of the subdeflectors of the second position-correcting deflector set deflects the beam at equal but opposite deflection angles, thereby ensuring the beam exits each position-correcting deflector set at an angle relative to the optical axis that is the same angle by which the beam enters the respective position-correcting deflector set.

12. In a moving-trajectory projection system for transferring a pattern from a mask to a substrate wherein the pattern is subdivided into a plurality of mask subfields each defining a separate portion of the pattern, the mask subfields being separated from one another by boundary regions that do not define any portion of the pattern, and the projection system including a moving trajectory optical system operable to cause a charged particle beam to pass through the mask subfields individually and form the pattern as an ordered assemblage of transfer subfields on a substrate, an improvement, comprising a position-correcting deflector set situated coaxially externally to the moving-trajectory optical system, the position-correcting deflector set being operable to deflect the charged particle beam so as to cause the portions of the pattern defined by the mask subfields to be transferred to the substrate as respective transfer subfields directly contacting each other in a serial manner without any intervening boundary regions.

13. A method for transferring a pattern, defined by plural mask subfields on a mask, each mask subfield defining a portion of the pattern and being separated from one another by boundary regions that do not define any portion of the pattern, from the mask to a substrate, the method comprising:

(a) directing a charged particle beam to pass serially through plural mask subfields;

(b) passing the beam through an optical system operable to deflect the beam sufficiently to cause the beam to be incident on a sensitive substrate so as to form on the substrate transfer subfields corresponding to the mask subfields through which the beam passed;

(c) passing the beam through a first position-correcting deflector set situated coaxially with respect to the optical system and being operable to cause deflection of the beam sufficient to cause the portions of the pattern represented by the transfer subfields on the substrate to directly contact each other in a serial manner without any intervening boundary regions.

14. The method of claim 13, wherein step (c) further comprises passing the beam through a second position-correcting deflector set after the beam passes through the first position-correcting deflector set.

15. The method of claim 13, wherein step (b) comprises passing the beam through an optical system comprising a first MTP deflector set, a second MTP deflector set, an MTP projection lens, and an MTP objective lens.

16. The method of claim 13, wherein the first position-correcting deflector set is arranged relative to the beam to cause the beam to be displaced in a manner by which the beam in incident on the substrate perpendicularly to the substrate.

17. The method of claim 16, wherein the first position-correcting deflector set displaces the beam on the substrate by an amount corresponding to the number of boundary regions between the respective mask subfield and the optical axis.

18. A charged particle beam pattern transfer apparatus for transferring to a substrate a pattern defined by multiple subfields on a mask, the apparatus comprising:

(a) a first main deflector set situated relative to an optical axis of the apparatus, the first main deflector set being operable to reduce off-axis aberrations;

(b) an imaging lens system operable to focus the charged particle beam deflected by the first deflector set;

(c) a second main deflector set situated relative to the optical axis, the second main deflector set being operable to reduce off-axis aberrations; and (d) a first position-correcting deflector set situated relative to the optical axis between either the mask and the first main deflector set or the second main deflector set and the substrate, the first position-correcting deflector set being operable to deflect the charged particle beam and thus correct the position at which the charged particle beam, that has passed through a mask subfield, is incident upon the substrate so as to compensate for any discrepancies in the positions of the transfer subfields relative to each other compared to the positions of the mask subfields relative to each other.

19. The apparatus of claim 18, wherein each of the first and second main deflector sets are moving-trajectory-projection deflector sets.

20. The apparatus of claim 18, wherein the mask subfields are separated from each other by boundary regions, the first position-correcting deflector set being operable to deflect the charged particle beam in a manner whereby the boundary regions are not reproduced between transfer subfields on the substrate.

21. The apparatus of claim 18, further comprising a second position-correcting deflector set, wherein the first position-correcting deflector set is situated between the mask and the first main deflector set and the second position-correcting deflector set is situated between the second main deflector set and the substrate, the second position-correcting deflector set being operable to deflect the charged particle beam and thus correct the position at which the charged particle beam, that has passed through a mask subfield, is incident upon the substrate so as to compensate for any discrepancies in the positions of the transfer subfields relative to each other compared to the positions of the mask subfields relative to each other.

\* \* \* \* \*

UNITED STATES PATENT AND TRADEMARK OFFICE
CERTIFICATE OF CORRECTION

PATENT NO. : 5,847,402
DATED : December 8, 1998
INVENTOR(S) : Mamoru Nakasuji

It is certified that error appears in the above-indentified patent and that said Letters Patent is hereby corrected as shown below:

On the Title Page

First column, item [56], References Cited, U.S. Patent Documents, the following U.S. patents should be added:

|   |   |   |
|---|---|---|
| 4,467,211 | 8/1984 | Smith et al. |
| 5,153,441 | 10/1992 | Moriizumi |
| 5,304,811 | 4/1994 | Yamada et al. |
| 5,523,576 | 6/1996 | Koike et al. |
| 5,635,719 | 6/1997 | Petric |
| 5,689,117 | 11/1997 | Nakasuji |

Column 3, line 5, insert a period --.-- after the ellipsis ". . .".

Column 4, line 54, delete the first occurrence of "a".

Column 7, line 62, "VW" should be --$V_W$--.

Column 7, line 63, "VM" should be --$V_M$--.

Column 8, line 9, "VM" should be --$V_M$--.

Column 8, line 10, "VW" should be --$V_W$--.

UNITED STATES PATENT AND TRADEMARK OFFICE
CERTIFICATE OF CORRECTION

PATENT NO. : 5,847,402
DATED : December 8, 1998
INVENTOR(S) : Mamoru Nakasuji

It is certified that error appears in the above-indentified patent and that said Letters Patent is hereby corrected as shown below:

Column 8, line 11, "VM = $\beta[(L_{1x} + L_{2x})/L_{1x}] \cdot VW$" should be
--$V_M = \beta[(L_{1x} + L_{2x})/L_{1x}] \cdot V_W$--.

Column 9, line 45, "direction thus require" should be --direction, thus requiring--.

In the Claims:

Column 12, line 8, claim 16, "in" should be --is--.

Signed and Sealed this

Twenty-sixth Day of October, 1999

Q. TODD DICKINSON

*Attest:*

*Attesting Officer*    Acting Commissioner of Patents and Trademarks